United States Patent [19]
Anagnostopoulos

[11] Patent Number: 5,210,049
[45] Date of Patent: May 11, 1993

[54] METHOD OF MAKING A SOLID STATE IMAGE SENSOR

[75] Inventor: Constantine N. Anagnostopoulos, Mendon, N.Y.

[73] Assignee: Eastman Kodak Company, Rochester, N.Y.

[21] Appl. No.: 874,880

[22] Filed: Apr. 28, 1992

[51] Int. Cl.$^5$ .............................................. H01L 21/70
[52] U.S. Cl. .......................................... 437/53; 437/4; 437/49; 437/50; 437/233
[58] Field of Search ...................... 437/49, 50, 53, 2, 3, 437/4, 233, 916; 357/24; 358/213.29

[56] References Cited

U.S. PATENT DOCUMENTS

| | | | |
|---|---|---|---|
| 3,927,468 | 12/1975 | Anthony et al. | 437/233 |
| 4,077,112 | 3/1978 | Theumissen et al. | 437/53 |
| 4,227,202 | 10/1980 | Tasch, Jr. et al. | 437/53 |
| 4,242,694 | 12/1980 | Koike et al. | 357/30 |
| 4,559,550 | 12/1985 | Koike et al. | 357/24 |
| 4,613,402 | 9/1986 | Losee et al. | 156/643 |
| 4,700,459 | 10/1987 | Peek | 437/53 |
| 4,746,622 | 11/1988 | Hawkins et al. | 437/53 |
| 4,862,237 | 8/1989 | Morozumi | 357/30 |
| 5,051,832 | 9/1991 | Losee et al. | 358/213.29 |

OTHER PUBLICATIONS

The Pinned Photodiode For an Interline-Transfer CCD Image Sensor by Bruce C. Burkey et al., Proceedings IEEE IEDM, vol. 84, pp. 28–31, Dec. 1984.
Transmittance of Air/SiO$_2$/Polysilicon/SiO$_2$/Si Structures by C. Anagnostopoulos et al. in IEEE Journal of Solid-State Circuits, Jun. 1975, pp. 177–179.

Primary Examiner—Tom Thomas
Attorney, Agent, or Firm—Stephen C. Kaufman

[57] ABSTRACT

The present invention is directed to a method of making an image sensor having a CCD shift register and at least one photocapacitor wherein features of the shift register and photocapacitor are commonly made and the photocapacitor has a thin plate of conductive polycrystalline silicon. The method includes the steps of embedding into a body of a semiconductor material of one conductivity type dopants of the opposite conductivity type to simultaneously form a channel region of the shift register and a channel region of a photocapacitor. A layer of a dielectric material is formed on the body and over the channel regions. A layer of conductive polycrystalline silicon is formed on the dielectric layer and is defined to form a top plate of the photocapacitor over the photocapacitor channel region and at least some gate electrodes of the shift register over the shift register channel region. The top plate of the photocapacitor is then thinned, such as by etching, to a thickness which allows reduced absorption and interference losses of the incident illumination and, thus, improves the light reaching the photocapacitor channel region beneath the top plate and the portion of the body beneath the photocapacitor channel region.

14 Claims, 1 Drawing Sheet

METHOD OF MAKING A SOLID STATE IMAGE SENSOR

FIELD OF THE INVENTION

The present invention relates to a method of making a solid state image sensor, and, more particularly, to a method of making a solid state image sensor having photocapacitors as photodetectors and charge-coupled device (CCD) shift registers.

BACKGROUND OF THE INVENTION

One type of solid state image sensor comprises a substrate body of a semiconductor material having therein a plurality of photodetectors arranged in an array of at least one line. The array may be a single row for a line array, or a plurality of rows and columns for an area array. The photodetectors receive the light from the image and convert the light into charges which are stored in the photodetector. Transfer means, such as a CCD shift register, extends along each line of the photodetectors. The shift register is adapted to receive the charges from the photodetectors and transfer the charges to an output circuit.

One type of photodetector commonly used is a photodiode, and particularly a pinned photodiode. Such a pinned photodiode is described in the article of B.C. Burkey et al. entitled "The Pinned Photodiode for an Interline Transfer CCD Imager", PROCEEDINGS IEEE IEDM, Vol 84, pgs. 28-31, December 1984. The pinned photodiode is used because of its ability to contain large amounts of charge, i.e., large charge capacity. However, certain types of image sensors use photodetectors which are relatively large in size. When pinned photodiodes are used for such large size photodetectors, they provide a charge capacity which is much greater than that which can be handled by the CCD shift register. Thus, the operation of the imager is adversely affected, if, for example, lateral antiblooming is desired. Another problem which can arise with pinned photodiodes results from the fact that the pinned diodes are formed by steps separate from the steps used to form the CCD shift register. Thus process variations which would vary the characteristics of the pinned photodiodes would affect the CCD shift register differently. This could result in photodiodes that have charge capacity that is not well matched to that of the CCD shift register.

Another type of photodetector which has been used in conjunction with CCD shift registers is the photocapacitor. The photocapacitor comprises a lightly conductive region in the body of the image sensor which serves as one plate of the capacitor. A layer of a dielectric material is on the surface of the body and is over the lightly conductive region to serve as the dielectric of the photocapacitor. A layer of a conductive material, such as conductive polycrystalline silicon, is on the dielectric layer and over the lightly conductive region to serve as the other plate of the photocapacitor. Polycrystalline silicon is generally used for the second plate of the photocapacitor since this material is also generally used for the gate electrodes of the CCD shift register. However, this raises a problem since the polycrystalline silicon layer used for the plate of the photocapacitor must be thin, about 500 angstroms, to allow light, especially in the blue region of the spectrum, to pass therethrough. See, for example, the article of C. Anagnostopoulos et al., entitled "Transmittance of Air/$SiO_2$/Polysilicon/$SiO_2$/Si Structures", published in IEEE JOURNAL OF SOLID-STATE CIRCUITS, June, 1975, pgs. 177-179. However, the polycrystalline silicon layer used for the gate electrodes of the CCD shift register is relatively thick, several thousand angstroms. To deposit a thin layer of the polycrystalline silicon for the photocapacitor and a thicker layer for the CCD shift register gate electrodes complicates the process for making the shift register. Also, it is difficult to connect a terminal to the thin plate layer, which is necessary for the operation of the photocapacitor.

SUMMARY OF THE INVENTION

The present invention is directed to a method of making a solid state image sensor having photocapacitor type photodetectors and CCD shift registers in which a single layer of polycrystalline silicon is used to form both some of the gate electrodes of the CCD shift register and the plate of the photocapacitors. The portions of the polycrystalline silicon layer over a lightly conductive channel region of each photocapacitor is etched to thin it to a desired thickness to reduce absorption in the blue region of the spectrum, and interference losses in the entire visible spectrum so as to improve the light which passes therethrough into the body of the device.

The present invention is in a method of making an image sensor having a charge-coupled device shift register and at least one photocapacitor. The method comprises forming in a body of a semiconductor material a lightly conductive buried channel region of the photocapacitor. A layer of a dielectric material is formed on the body over the photocapacitor buried channel region. A layer of conductive polycrystalline silicon is formed on the dielectric layer over the photocapacitor buried channel region and the polycrystalline silicon layer is thinned to a thickness which reduces absorption and interference losses of the incident light particularly in the blue region of the spectrum so as to improve the light reaching the lightly conductive region and the region of the body beneath the lightly conductive region.

The invention will be better understood from the following more detailed description taken in conjunction with the accompanying drawings and claims.

The drawings are not necessarily to scale.

DETAILED DESCRIPTION

Figure 1:
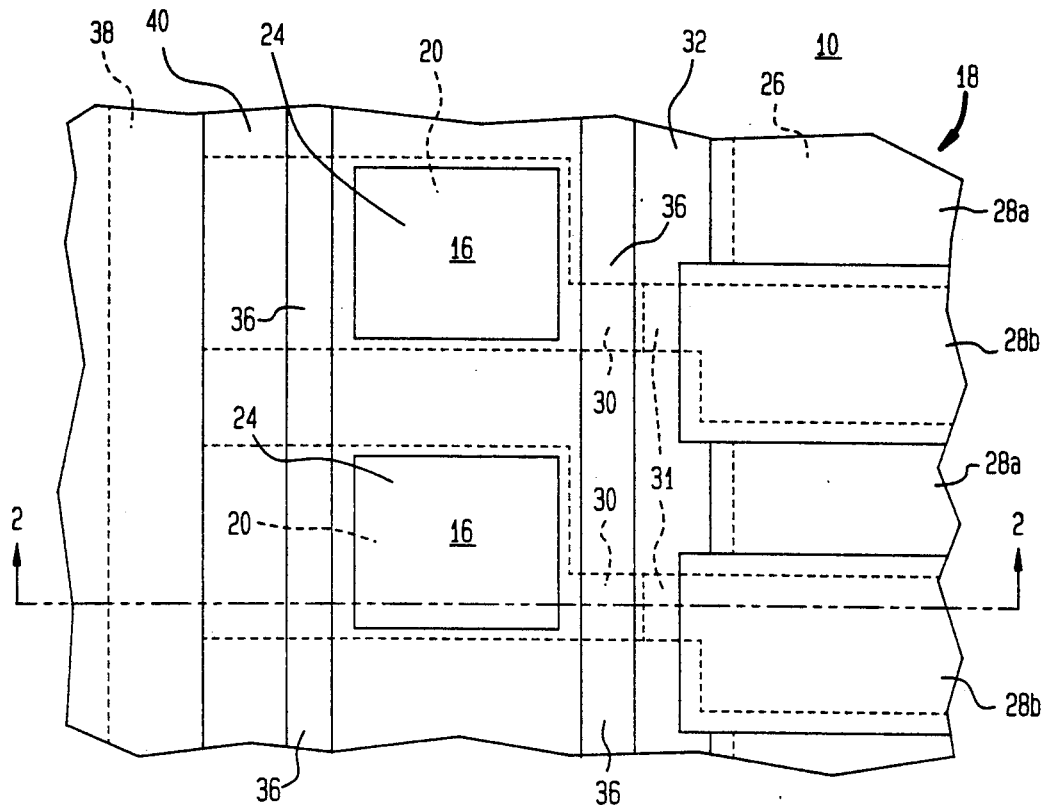
FIG. 1 is a top plan view of a portion of a solid state image sensor made by the method of the present invention.
Figure 2:
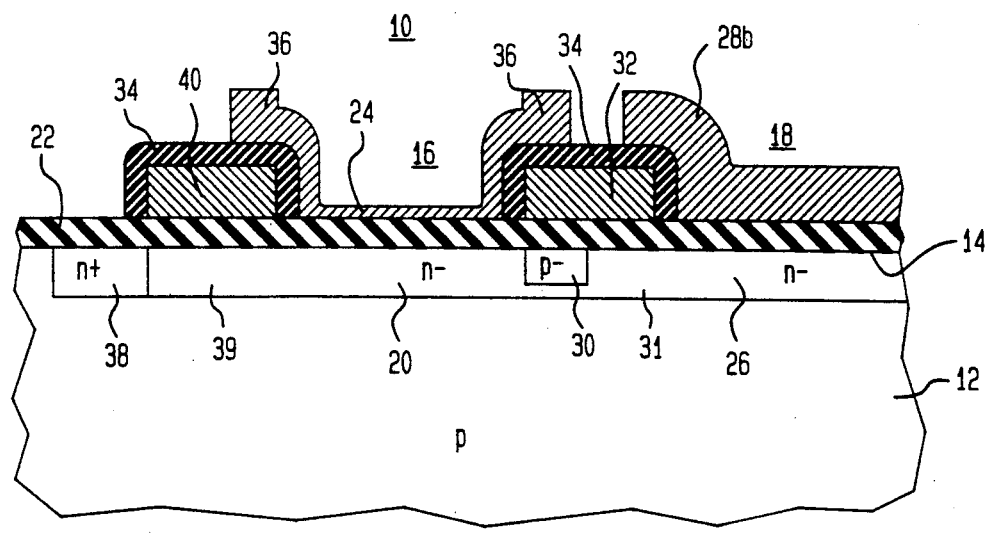
FIG. 2 is a cross-sectional view taken along line 2—2 of FIG. 1.

Referring now to FIGS. 1 and 2, there are shown a top plan view and cross-sectional view, respectively, of a portion of a solid state image sensor 10 made in accordance with a method of the present invention. Image sensor 10 comprises a substrate body 12 of a semiconductor material of one conductivity type, such as p-type conductivity silicon, having a surface 14. In the body 12 at the surface 14 are a plurality of photocapacitors 16 which serve as photodetectors. The photocapacitors 16 are arranged in an array of at least one line or row. Along the line of the photocapacitors 16 is a CCD shift register 18.

Each of the photocapacitors 16 comprises a lightly conductive region 20 of n- type conductivity in the body 12 at the surface 14, typically referred to as the buried channel region. On the surface 14 of the body 12 is a layer 22 of a dielectric material, typically silicon dioxide. The portion of the dielectric layer 22 which is over the conductive region 20 serves as the dielectric of the photocapacitor 16. A layer 24 of conductive polycrystalline silicon is on the insulating layer 22 and is over the lightly conductive region 20. The polycrystalline silicon layer 24 is sufficiently thin to allow light to pass therethrough, a thickness in the order of 500 angstroms, and serves as the top plate of the photocapacitor 16. The p-type body 12 forms the bottom layer of the photocapacitor 16. The thin top plate 24 allows more light to pass into the buried channel region 20, some of which light passes through the buried channel region 20 into the body 12 beneath the buried channel region 20. The light entering the body 12 generates electrons which are then captured in the buried channel region 20.

The CCD shift register 18 comprises a channel region 26 in the body 12 at the surface 14 and extending along but spaced from the line of photocapacitors 16. The channel region 26 is of the same conductivity type as the conductive region 20 of the photocapacitors 16. The dielectric layer 22 also extends over the channel region 26 to serve as the dielectric of the CCD shift register 18. First and second sets of gate electrodes 28a and 28b are on the dielectric layer 22 and extend across the channel region 26. The CCD shift register 18 shown is a two-phase CCD having one gate from each set adjacent each photocapacitor 16. The gate electrodes 28a and 28b are formed of a conductive material, preferably polycrystalline silicon of a thickness of several thousand angstroms.

A transfer region 31 of n type conductivity is in the body 12 and extends to the surface 14. A separate transfer region 31 extends along the surface 14 between the channel region 26 of the CCD shift register 18 and the buried channel region 20 of each of the photocapacitors 16. The transfer regions 31 are narrow and extend only from a gate electrode 28b to the respective photocapacitor buried channel region 20. A transfer gate 32 is on the dielectric layer 22 and extends over the transfer regions 31 between the gate electrodes 28a (28b) and the photocapacitor top plate 24. The transfer gate 32 is of a conductive material, such as polycrystalline silicon, and is of the same thickness as the gate electrodes 28a and 28b. A layer 34 of an insulating material, typically silicon dioxide, is over the transfer gate 32. The gate electrodes 28a and 28b extend over the insulating layer 34 and slightly overlap the transfer gate 32.

The photocapacitor top plates 24 are all portions of a single layer of polycrystalline silicon which extends over the insulating layer 34 parallel to the transfer gate 32, and has a rim 36 which overlaps a portion of the transfer gate 32. The rim 36 is of a thickness equal to that of the gate electrodes 28b.

A separate barrier region 30 of lightly doped p-type conductivity (shown as of p type conductivity) is in the body 12 and extends to the surface 14 across each of the transfer regions 31 beneath the transfer gate 32. The barrier regions 30 serve to prevent charge flow back into the photocapacitor 16 during the operation of the image sensor 10.

An overflow drain region 38 of highly conductive n-type conductivity (shown as n+type conductivity) is in the body 12 at the surface 14 at the side of the photocapacitors 16 away from the CCD shift register 18. An overflow transfer region 39 of n type conductivity is in the body 12 and extends to the surface 14. The overflow transfer region 39 is a portion of the same n-type region as the buried channel region 20, and extends along the surface 14 between the buried channel region 20 of the photocapacitors 16 and the overflow drain region 38. A lateral overflow transfer gate 40 is on the dielectric layer 22 and extends over the overflow transfer region 39 between the photocapacitors 16 and the overflow drain region 38. The overflow transfer gate 40 is of a conductive material, such as polycrystalline silicon, of the same thickness as the gate electrodes 28a and 28b. The insulating layer 34 also extends over the overflow transfer gate 40. The rim 36 of the photocapacitor second plate 24 also partially overlaps the overflow transfer gate 40.

To make the image sensor 10 in accordance with the method of the present invention, the buried channel regions 20 of the photocapacitors 16, the channel region 26 of the CCD shift register 18, the transfer region 31 and the overflow transfer regions 39 are formed simultaneously. This can be achieved by placing a masking layer, such as a layer of a photoresist, over the surface 14 of the body 12. The masking layer is then pattern to define openings therethrough where the conductive region 20 and channel region 26 are to be formed. Ions of an n-type dopant are then implanted into the body 12 through the openings in the masking layer The barrier region 30 is then formed by an edge aligned technique such as described in U.S. Pat. No. 4,613,402 to D.L Losee et al., issued Sep. 23, 1986, entitled "Method of Making Edge-Aligned Implants and Electrodes Therefore".

The dielectric layer 22 is then formed over the surface 14 of the body 12. This can be achieved by heating the body 12 in an atmosphere containing oxygen to convert the surface 14 to a layer of silicon dioxide of the desired thickness. A first layer of doped polycrystalline silicon is then formed on the dielectric layer 22. The polycrystalline silicon is formed by a chemical vapor deposition technique in which the body 12 is exposed to a gas containing silicon, such as silane, and the gas is heated to deposit polycrystalline silicon on the surface 14. A dopant may be included in the deposition process to deposit a doped and therefore conductive layer of polycrystalline silicon or the deposited layer may be doped afterwards. The first layer of polycrystalline silicon is then defined using standard photolithographic techniques and etching to form the transfer gate 32, the overflow transfer gate 4 and a first set of the CCD shift register gate electrodes 28a. The insulating layer 34 is then formed over the transfer gate 32, the overflow transfer gate 40 and the first set of shift register gate electrodes 28a. This is achieved by heating the gates in an atmosphere containing oxygen.

A second layer of polycrystalline silicon is then deposited over the insulating layer 34 and the exposed surface areas of the dielectric layer 22. The second polycrystalline silicon layer can be deposited with a dopant therein or can be doped after it is deposited. The second polycrystalline silicon layer is then defined by photolithography and etching to form the layer which contains the top plates 24 of the photocapacitors 16 and the second set of gate electrodes 28b of the CCD shift register 18. The layer containing the top plates 24 is formed partially overlapping the overflow transfer gate 40 and the transfer gate 32 and the second set of gate electrodes 28b are formed partially overlapping the transfer gate 32 and the first set of gate electrodes 28a.

At this point the top plates 24 are of the same thickness as the gate electrodes 28b, which typically are several thousand angstroms. The portion of layer containing the top plates 24 over the conductive regions 20 are then thinned to a thickness (e.g., about 500 angstroms). This is achieved by masking the surface of the image sensor except for the portion of the plates 24 to be thinned and using a plasma etching process to etch the polycrystalline silicon. This can be achieved in a plasma etching chamber, such as a Plasma-Therm inline polysilicon etcher, at a pressure of about 250 microtorr, a power of about 90 watts and using an etching gas which is a mixture of $SF_6$, $N_2$ and $CHCl_3$. The overflow drain regions 38 are then formed by ion implanting an n-type dopant into the body 12 through a suitable mask.

The method of the present invention has the advantage that the photocapacitors 16 and CCD shift register 18 are formed substantially simultaneously by the same steps. The conductive regions 20 of the photocapacitors 16 and the channel region 26 of the shift register 18 are formed by the same diffusion or ion implantation step. Thus, any process variations will cause the same variations in the conductive regions 20 and the channel region 26. Thus, the charge capacity of the photocapacitors 16 and the CCD shift register 18 will vary together so that the two will remain compatible even if there are process variations. Also, by having the elements of the photocapacitors 16 formed at the same time as the elements of the CCD shift register 18, i.e., the conductive regions 20 with the channel region 26 an the top plates 24 with the second set of the gate electrodes 28b, the number of steps necessary to make the image sensor 10 is maintained at a minimum. This makes manufacture of the image sensor 10 easier and less expensive. In addition, by forming the top plates 24 from a thick layer of polycrystalline silicon and reducing the thickness of a portion of the top plates 24, a thick rim 36 is provided around the top plates 24. This thick rim 36 allows for conventional contacts and metalization to be used in making electrical contact to the photocapacitors 16.

It is to be appreciated and understood that the specific embodiments of the invention are merely illustrative of the general principles of the invention. Various modifications may be made consistent with the principles set forth. For example, the structure of the transfer regions between the photocapacitors and the CCD shift register and the structure of the overflow drain may be changed to any desired structure. Still further, the composition of the etching gas may vary as long as it etches the polycrystalline silicon. In addition, the polycrystalline silicon plate of the photocapacitor can be defined from any of the layers of the material which are used to form the other gates of the device.

What is claimed is:

1. In a method of making an image sensor having a charge-coupled device shift register and at least one photocapacitor the steps of:
    forming in a body of a semiconductor material a conductive region;
    forming a layer of a dielectric material on the body and over the conductive region;
    forming a layer of conductive polycrystalline silicon on the dielectric layer over the conductive region hereby forming a top plate of the photocapacitor and at least a gate electrode of the shift register; and
    thinning the polycrystalline silicon layer to a thickness which reduces absorption and interferences losses of the incident light so as to improve the light reaching the conductive region and the region of the body directly beneath the conductive region.

2. The method of claim 1 wherein the polycrystalline silicon layer is thinned by etching.

3. The method of claim 2 wherein the polycrystalline silicon layer is etched with a plasma etchant.

4. The method of claim 3 wherein the polycrystalline silicon layer is formed by depositing polycrystalline silicon on the dielectric layer.

5. The method of claim 4 in which the polycrystalline silicon layer is deposited to a selected thickness and etching to a thickness of about 500 angstroms.

6. The method of claim 4 in which the polycrystalline silicon layer is formed to extend beyond a portion of the conductive region and only the portion of the polycrystalline silicon layer over the conductive region is etched leaving a thicker rim portion.

7. A method of making an image sensor having a charge-coupled device shift register and at least one photocapacitor comprising the steps of:
    forming in a body of a semiconductor material of one conductivity type having a surface a shift register channel region of the opposite conductivity type;
    forming in the body adjacent to but spaced from the channel region a photocapacitor channel region of the opposite conductivity type;
    forming a layer of a dielectric material on the body surface and over the channel regions;
    forming shift register gate electrodes of conductive polycrystalline silicon on the dielectric layer and over the shift register channel region;
    forming a layer of conductive polycrystalline silicon on the dielectric layer and over the photocapacitor channel region to serve as a top plate of the photocapacitor; and
    thinning the top plate layer to a thickness which reduces absorption and interference losses of the incident light and thus improve the light reaching the photocapacitor channel region and the region of the body directly beneath the photocapacitor channel region.

8. The method of claim 7 in which the channel regions are formed simultaneously by embedding a dopant of the second conductivity type into the body.

9. The method of claim 8 in which at least some of the gate electrodes and the top plates are formed by depositing at least one layer of polycrystalline silicon on the dielectric layer and defining the layer to form the gate electrodes and the top plate.

10. The method of claim 9 in which the top plate and at least some of the gate electrodes are defined from a common layer of polycrystalline silicon.

11. The method of claim 10 wherein the top plate layer is thinned by etching.

12. The method of claim 11 wherein the top plate layer is etched with a plasma etchant.

13. The method of claim 12 in which the polycrystalline silicon layer is deposited to a selected thickness and etching the top plate layer to a thickness of about 500 angstroms.

14. The method of claim 12 in which the top plate is defined to extend beyond a portion of the photocapacitor channel region and only the portion of the top plate which is over the photocapacitor channel region is thinned leaving the top plate with a thicker rim portion.

* * * * *